(12) United States Patent
Decker et al.

(10) Patent No.: US 7,157,135 B2
(45) Date of Patent: Jan. 2, 2007

(54) CO-EXTRUDED HIGH REFRACTIVE INDEX COATED EMBOSSABLE FILM

(75) Inventors: Wolfgang Decker, Wakefield, RI (US); Christopher S. Curry, Exeter, RI (US); Hiroaki Watanabe, Warwick, RI (US); Arthur Eric Bartholomay, Coventry, RI (US)

(73) Assignee: Toray Plastics (America), Inc., North Kingstown, RI (US)

( * ) Notice: Subject to any disclaimer, the term of this patent is extended or adjusted under 35 U.S.C. 154(b) by 71 days.

(21) Appl. No.: 10/863,621

(22) Filed: Jun. 9, 2004

(65) Prior Publication Data
US 2005/0276980 A1 Dec. 15, 2005

(51) Int. Cl.
B32B 7/02 (2006.01)
B32B 18/00 (2006.01)
B32B 27/06 (2006.01)
B32B 27/08 (2006.01)
B32B 27/32 (2006.01)
B32B 32/36 (2006.01)
B32B 32/34 (2006.01)
B32B 37/16 (2006.01)

(52) U.S. Cl. ............... 428/212; 428/215; 428/216; 428/332; 428/334; 428/339; 428/457; 428/458; 428/461; 428/463; 428/464; 428/469; 428/472; 428/473.5; 428/474.4; 428/475.2; 428/475.5; 428/476.3; 428/480; 428/483; 428/515; 428/910; 264/173.16; 264/173.19; 264/290.2; 427/248.1; 427/255.19; 427/407.1; 427/412.1; 427/412.5; 427/419.2

(58) Field of Classification Search .................. None
See application file for complete search history.

(56) References Cited

U.S. PATENT DOCUMENTS

| | | | | |
|---|---|---|---|---|
| 4,443,397 A * | 4/1984 | Hahn et al. | ............ | 264/173.12 |
| 4,477,521 A * | 10/1984 | Lehmann et al. | ............ | 428/336 |
| 4,734,335 A * | 3/1988 | Monzer | ............ | 428/480 |
| 4,837,072 A * | 6/1989 | Kraetschmer | ............ | 428/201 |
| 5,004,649 A * | 4/1991 | Yamasaki et al. | ............ | 428/461 |
| 5,046,800 A * | 9/1991 | Blyler et al. | ............ | 385/131 |
| 5,122,905 A * | 6/1992 | Wheatley et al. | ............ | 359/586 |
| 5,319,475 A * | 6/1994 | Kay et al. | ............ | 359/2 |
| 5,405,675 A * | 4/1995 | Sawka et al. | ............ | 428/195.1 |
| 5,510,171 A * | 4/1996 | Faykish | ............ | 428/32.62 |
| 5,518,817 A * | 5/1996 | Yamasaki et al. | ............ | 428/411.1 |
| 5,585,144 A * | 12/1996 | Waitts | ............ | 427/258 |
| 5,781,316 A * | 7/1998 | Strahl et al. | ............ | 359/3 |
| 5,834,096 A * | 11/1998 | Waitts | ............ | 428/195.1 |
| 6,207,260 B1 * | 3/2001 | Wheatley et al. | ............ | 428/212 |
| 6,277,496 B1 * | 8/2001 | Lohwasser et al. | ............ | 428/469 |

(Continued)

FOREIGN PATENT DOCUMENTS

JP 07-246800 * 9/1995

(Continued)

OTHER PUBLICATIONS

Schimtz, Peter et al., "Films." Ullmann's Encyclopedia of Industrial Chemistry, 5th Ed., vol. A11 (1988), pp. 85-95, 108-110.*

*Primary Examiner*—Vivian Chen
(74) *Attorney, Agent, or Firm*—Morrison & Foerster LLP

(57) ABSTRACT

An embossable film for creating holograms and diffraction gratings and methods of producing the embossable films are provided. The embossable film includes a base layer and a co-extruded embossable layer that is coated with a transparent high refractive index (HRI) coating prior to embossing.

21 Claims, 2 Drawing Sheets

U.S. PATENT DOCUMENTS

| | | | |
|---|---|---|---|
| 6,352,761 B1* | 3/2002 | Hebrink et al. | 428/212 |
| 6,368,699 B1* | 4/2002 | Gilbert et al. | 428/212 |
| 6,391,425 B1* | 5/2002 | Migliorini et al. | 428/172 |
| 6,452,698 B1* | 9/2002 | Vlcek et al. | 359/3 |
| 6,459,514 B1* | 10/2002 | Gilbert et al. | 359/15 |
| 6,737,170 B1* | 5/2004 | Fitch et al. | 428/480 |
| 6,761,958 B1* | 7/2004 | Fitch et al. | 428/141 |
| 6,882,452 B1* | 4/2005 | Decker et al. | 359/2 |
| 2003/0058491 A1* | 3/2003 | Holmes et al. | 359/2 |
| 2003/0072931 A1* | 4/2003 | Hebrink et al. | 428/212 |
| 2003/0096102 A1* | 5/2003 | Yoshihara et al. | 428/330 |
| 2003/0108756 A1* | 6/2003 | Fitch et al. | 428/480 |
| 2003/0164611 A1* | 9/2003 | Scheider et al. | 283/57 |
| 2004/0229033 A1* | 11/2004 | Fitch et al. | 428/328 |
| 2004/0229065 A1* | 11/2004 | Decker et al. | 428/515 |

FOREIGN PATENT DOCUMENTS

| | | | |
|---|---|---|---|
| JP | 2004-004404 | * | 1/2004 |
| WO | WO 01-64434 | * | 9/2001 |

* cited by examiner

CO-EXTRUDED HIGH REFRACTIVE INDEX COATED EMBOSSABLE FILM

FIELD OF INVENTION

This invention relates to embossable films for creating holograms and diffraction gratings. More specifically, this invention relates to an embossable film that includes a base substrate layer and a co-extruded embossable layer that is coated with a transparent high refractive index (HRI) coating prior to embossing.

BACKGROUND

Holograms have come into wide usage as decorative indicia due to their unique visual appearance. In addition, the difficulty in making and reproducing holograms has made them a common authentication feature on security items such as credit cards, driver's licenses and access (identification) cards. Holograms have also been used as security features on products in order to prevent piracy or counterfeiting.

The most common method of creating a hologram is to create a grating pattern in a surface so that particular structures become visible upon diffraction of light in the grating. U.S. Pat. No. 3,578,845 to Brooks et al. describes how diffraction gratings are typically generated. Typically, the diffraction patterns are embossed into a thermo-formable substrate such as an embossable polymer film. This process is performed by pressing a heated stamp made from a hard material to engrave the desired grating from the contact surface of the stamp onto the embossable substrate.

Diffraction requires that the medium the grating is made of and the media bordering the grating have a difference in optical index. The larger this difference is, the brighter the diffraction will appear. To create highest diffraction, full reflective materials such as aluminum, copper or gold are thin film coated onto the surface of the grating.

Alternately, the grating is coated with a thin film of transparent material having a high refractive index (HRI) such as Zinc Sulfide (ZnS), Iron Oxide ($Fe_2O_3$), Lead Oxide (PbO), Zinc Selenide (ZnSe), Cadmium Sulfide (CdS), Titanium Oxide ($TiO_2$), Lead Chloride ($PbCl_2$), Cerium Oxide ($CeO_2$), Tantalum Oxide ($Ta_2O_5$), Zinc Oxide (ZnO), Cadmium Oxide (CdO), Neodymium Oxide ($Nd_2O_3$) or Aluminum Oxide ($Al_2O_3$). Substrates coated with a transparent HRI coating are often used for security applications such as identification or access cards, where it is desired that information positioned behind the hologram remains visible to the unaided eye.

While the grating can be embossed into the substrate material with a stamp, a more common, economical method, is the use of continuous embossing systems. Such embossing system are described for example in U.S. Pat. Nos. 4,913,858 and 5,164,227, both to Miekka et al. In these methods the grating structure is engraved into the surface of a roll, which continuously presses its surface pattern into the web type substrate passing between the embossing roll and a backside roll. In order to obtain the grating in the substrate's surface, the thermo-formable layer on this surface is heated. This can be achieved either by preheating the substrate to the required temperature, or by heating the embossing roll.

Commonly the art differentiates between "Soft Embossing" and "Hard Embossing". Soft Embossing describes the process where the embossing is performed before a high reflective index (HRI) layer is applied. "Hard Embossing" is performed by creating the grating through the HRI layer. While Hard Embossing is done on substrates coated with "soft" metals like aluminum, copper or gold, it is not typically done through semi-transparent reflection enhancement HRI layers like ZnS or $TiO_2$. Semi-transparent layers are coated thicker than metal coatings in order to achieve the brilliance and reflectivity typically desired. The typical coating thickness for ZnS for example is about 400–600 Angstroms (40–60 nm), while aluminum is typically coated with about 200 Angstroms or less. In addition, semi-transparent coatings are much harder than metal coatings. ZnS has a Mohs hardness of 4.5 Mohs, compared to a Mohs hardness of 2.75 for aluminum. These two factors would require higher embossing pressure on standard substrates and increase the wear on the embossing shims.

A common process for producing an embossable web type substrate such as an embossable polyethyleneterephthalate (PET) or polypropylene (PP) is to apply a thermo-formable coating onto at least one surface of the polymer film. This process is done off-line, i.e. after manufacturing of the polymer web. Embossable coatings typically are applied either as a water-based or as a solvent-based solution using coating systems well known in the art such as roll coating, gravure coating, air knife coating or rod coating, among others.

The coatings are dried in hot oven systems, designed to drive out the moisture and solvents and to lock the coating into a coherent structure. It is common, though, that an excessive amount of moisture or solvent is retained in the coating. HRI coatings, however, are typically applied using vacuum deposition processes such as physical vapor deposition. The exposure of the embossable coatings to a vacuum causes the remaining moisture or solvent to evaporate, a process called "outgassing". Outgassing is an unwanted reaction as it hinders the deposition of the HRI coating, causing uneven deposition of the HRI material and rendering the material useless for commercial application. Embossing done prior to vacuum coating exposes the coating to additional heat and pressure of the embossing process, improving the removal of entrapped moisture and solvents. This is an additional reason why the transparent HRI coating is typically not done until after application of the embossing.

As is described in U.S. patent application Ser. No. 10/087,689, filed Mar. 1, 2002, and Ser. No. 10/206,453, filed Jul. 26, 2002, the both of which hereby are incorporated in their entirety by reference, it would be desirable to provide an embossable film structure that is made at the point of film manufacturing. As is pointed out, however, embossable surfaces produced through a co-extrusion process need to have many of the same characteristics of the base film. Therefore, inherent viscosity (IV), melt strength, melt viscosity and the like are important parameters for getting the co-extruded layer through the film making process.

Typical materials that can survive this process are often analogs of the base film material itself. These materials suffer the problem of having low crystallinity and are, therefore, heat sealable. A heat sealable material will often stick to the embossing shim, rendering the embossed texture of little commercial quality. Such a co-extruded layer, however, would also be free of moisture or solvent, thus eliminating the above described problems of outgassing.

In addition, it would be desirable to have an embossable multi-layer film that is coated with a transparent HRI coating that can be embossed through the HRI coating, directly accepting holographic texture and presenting a good image after lamination. Such a material would offer higher flexibility for the production of semi-transparent holograms.

The nature of the HRI coating process requires that specific minimum lengths have to be coated. This length requirement is not given if HRI coating is applied prior to embossing. Such a material would allow for shorter, volume limited production of specific holograms. Especially in the area of high security holograms it would reduce the high risk requirement of moving high security holograms between facilities.

SUMMARY OF THE INVENTION

Described are embossable films and methods for making embossable films for creating holograms and diffraction gratings. The embossable films include a base substrate film and a co-extruded embossable layer. The embossable layer is coated with a transparent high refractive index (HRI) coating.

One embodiment of the embossable film includes a base substrate film, an embossable layer that is co-extruded with the base substrate film and a high reflective index coating on the surface of embossable layer.

Preferably, the embossable layer has a melting point that is at least 10° Celsius lower than the base substrate film. Preferably, the embossable film includes one of the following a polymers polyethylene terephthalate (PET), polyvinyl chloride, polyvinylidene chloride, polyethylene, polypropylene, polycarbonate, cellophane, acetate, nylon, polyvinyl alcohol, polyamide, polyamide-imide, ethylene-vinyl alcohol copolymer, polymethyl methacrylate, polyether sulfone, and polyether ether ketone.

Preferably, the embossable layer includes a low crystalline variation of the polymer of the substrate film selected from the following group of polymers: polyethylene terephthalate (PET), polyvinyl chloride, polyvinylidene chloride, polyethylene, polypropylene, polycarbonate, cellophane, acetate, nylon, polyvinyl alcohol, polyamide, polyamide-imide, ethylene-vinyl alcohol copolymer, polymethyl methacrylate, polyether sulfone, or polyether ether ketone. The low crystalline polymer becomes pliable at a lower temperature than the core polymer.

Preferably, the base substrate film has a thickness of between 7 μm and 120 μm. Preferably, the embossable layer has a thickness of 0.1 μm to 2.0 μm. Preferably, the transparent high reflective index layer comprises ZnS, $Sb_2S_3$, $Fe_2O_3$, PbO, ZnSe, CdS, $TiO_2$, $PbCl_2$, $CeO_2$, $Ta_2O_5$, ZnO, CdO, $Nd_2O_3$ or $Al_2O_3$. Preferably, the transparent high reflective index layer has a thickness of 50 Angstroms to 1500 Angstroms. Preferably, the transparent high reflective index layer is applied using a physical vapor deposition process.

An embodiment of a method of producing an embossable film includes co-extruding a polymer film including a base substrate film and an embossable layer, and applying a transparent high reflective index layer on top of the embossable layer.

An embodiment of a method of producing a diffraction grating includes providing a substrate film comprising a co-extruded base film and embossable layer, applying a transparent high reflective index layer on top of the embossable layer, and embossing the film to create a diffraction grating.

BRIEF DESCRIPTION OF THE DRAWING

The invention will be better understood by reference to the Detailed Description of the Invention when taken together with the attached drawings, wherein.

DETAILED DESCRIPTION OF THE INVENTION

Figure 1:
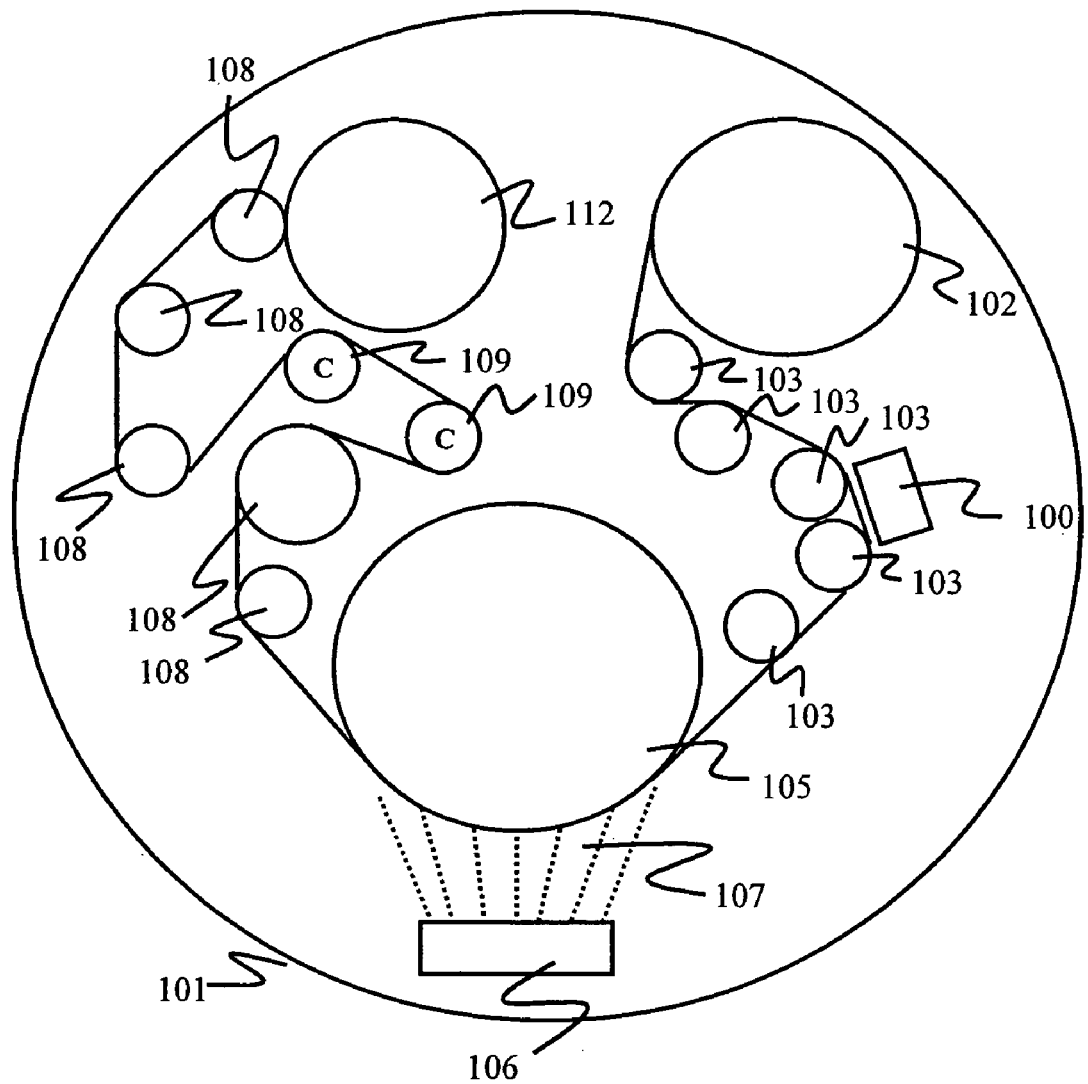
FIG. 1 is an apparatus for preparing applying a transparent HRI coating to a film substrate containing an embossable layer according to the invention.

The invention includes a semi-transparent embossable multi-layer film that has a transparent HRI coating and methods of making this film. The embossable multi-layer film can be embossed and is ready for lamination without the need for a subsequent transparent HRI coating step or a subsequent embossable coating step.

It has been found that by coating films of co-extruded polymer film layers with a an HRI coating, the films become embossable without having the disadvantage of sticking to the embossing shims. Co-extruded films are typically not used for embossing since the co-extruded layers exhibit heat-seal characteristics that can make the films stick to the embossing shims during the embossing process, which can destroy the embossed structure. By applying the HRI layer to the co-extruded polymer film prior to embossing, the HRI coating acts as a release coating, preventing the direct contact between the co-extruded layer and the embossing shim. This prevents the co-extruded layer from sticking to the embossing shim.

Preferably, the films made from co-extruded layers are used for "hard embossing" HRI coated materials. Embossing temperatures for co-extruded materials tend to be lower than off-line coated embossable coatings. This means that co-extruded layers can become softer when embossing is done at temperatures used for embossing typical off-line coated embossable layers that do not have HRI coatings. The higher softness or reduced viscosity of the in-line coated film allows the transfer of the surface structure from the embossing shim into the substrate surface through the HRI coating with similar heat and pressure as typical off-line embossed substrates that do not have HRI coatings. Accordingly, additional stress on the embossing shim is reduced and therefore, the lifetime of the shim when compared to embossing off-line coated substrates without HRI coatings is similar.

Preferably, the semi-transparent embossable multi-layer film includes at least a base substrate film, an embossable layer and a transparent HRI coating.

The base substrate film can be any suitable base film. Preferred base substrate films include polyethylene terephthalate (PET), polyvinyl chloride, polyvinylidene chloride, polyethylene, polypropylene, polycarbonate, cellophane, acetate, nylon, polyvinyl alcohol, polyamide, polyamide-imide, ethylene-vinyl alcohol copolymer, polymethyl methacrylate, polyether sulfone, and polyether ether ketone films.

The thickness of the base substrate film is preferably thick enough to be self-supporting but thin enough to be flexed, folded or creased without cracking. Preferably, the base substrate film has a thickness of between about 7 μm and about 120 μm, more preferably between about 9 μm and about 60 μm, most preferably between about 9 μm gauge and about 50 μm.

The base substrate film is preferably produced using an extrusion technique, which produces a melt stream of the base polymer. The extruded polymer is delivered through a die in the form of a molten curtain. Preferably, at lease one additional melt stream containing a low crystalline polymer is produced and mated with the first melt stream containing the base polymer, resulting in a multi-layer structure when extruded through the die. Preferably, the low crystalline polymer creating at least one skin of the molten curtain. The resulting melt curtain is preferably quenched on a casting drum.

Depending on the type of polymer and application, preferably the substrate is subsequently oriented. The substrate can be oriented in either the machine direction only or biaxially oriented using stretching methods known in the art such as roller trains and chain driven transverse stretchers.

Preferably, the embossable layer is made from a low crystalline polymer of the same kind as the base substrate film. Preferably, the embossable layer is made from a polymer that has a melting point that is at least about 10° Celsius, but preferably at least about 200 Celsius, lower than the associated polymer of the base substrate film.

The thickness of the embossable layer is preferably between about 0.1 µm and about 2.0 µm, more preferably between about 0.1 µm and about 0.8 µm, most preferable between about 0.1 µm and about 0.5 µm. A layer that is too thin can result in poor embossed image quality. A layer that is too thick is inefficient.

Preferred polymers for the embossable low crystalline layer include polyethylene terephthalate (PET), polyvinyl chloride, polyvinylidene chloride, polyethylene, polypropylene, polycarbonate, cellophane, acetate, nylon, polyvinyl alcohol, polyamide, polyamide-imide, ethylene-vinyl alcohol copolymer, polymethyl methacrylate, polyether sulfone, or polyether ether ketone and mixtures thereof.

A transparent HRI coating is applied on top of the embossable layer. In order to achieve sufficient reflectivity, the difference in refractive index between the embossed material and the HRI coating is preferably at least 0.3, more preferably more than 0.6.

Application of the transparent HRI material layer is preferably performed using a vacuum deposition process. Other conventional deposition techniques include reactive or non-reactive vacuum vapor deposition, physical vapor deposition (PVD), chemical vapor deposition (CVD), sputtering, electron beam deposition, ion beam assisted deposition and the like. Preferable transparent HRI materials include ZnS, $Sb_2S_3$, $Fe_2O_3$, PbO, ZnSe, CdS, $TiO_2$, $PbCl_2$, $CeO_2$, $Ta_2O_5$, ZnO, CdO and $Nd_2O_3$.

The thickness of the transparent HRI coating is preferably thick enough to provide good refractive properties (refract light) but not so thick as to inhibit its transparent properties. Preferably the transparent HRI coating has a thickness of about 50 Angstroms to about 1500 Angstroms. More preferably this coating has a thickness of about 50 Angstroms to about 1000 Angstroms, most preferably about 100 Angstroms to about 800 Angstroms.

FIG. 1 shows an apparatus for preparing a transparent HRI coating film from a film substrate containing an embossable layer. A vacuum chamber 101 containing a web transport system and an evaporator 106 containing a transparent HRI material is reduced to a predetermined pressure by a vacuum pump. An embossable multi-layer film 102 is unwound and transported through the chamber by an arrangement of driven and idling rollers 103. The embossable multi-layer film 102 is passed over a chilled coating drum 105 and then through a cloud of evaporated transparent HRI material 107 generated by an evaporator 106. The cool surface of the dielectric film causes the HRI material to condense on the surface of the embossable multilayer film 102 forming a thin layer of HRI material. The film is then passed over another arrangement of driven and idling rollers 108 and then rewound at position 112.

Although not required, when an embossable multi-layer film with high surface functionality is used, preferably a surface treatment is applied at position 100. The surface treatment activates a side of the embossable multi-layer film for the deposition of the transparent HRI layer. Exposing the surface of the embossable multi-layer film to an ionized gas, i.e. plasma, or a corona discharge is a preferable surface treatment.

The HRI evaporator 106 can be of any kind of evaporator capable of creating a vapor cloud that is sufficient to condense the HRI material on the surface of the embossable multi-layer film at an appropriate speed. Examples of appropriate evaporators include resistively heated evaporators, electron beam evaporators and sputter sources.

Figure 2:
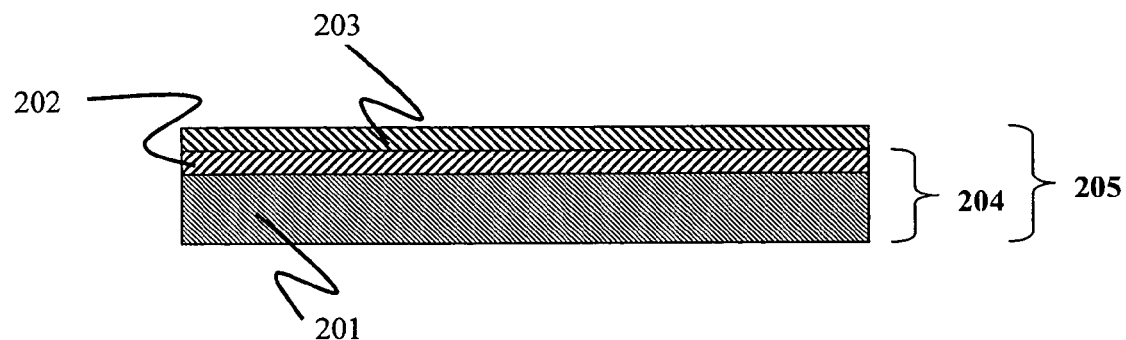
FIG. 2 is an embossable transparent HRI coated film according to the invention.

FIG. 2 shows a transparent HRI coated film 205 according to an embodiment of this invention. The embossable base material 204 is comprised of two layers 201 and 202. Layer 201 is a base substrate film. Layer 202 is the co-extruded embossable layer that is pliable under heat and can be embossed. Layer 203 is a transparent HRI coating applied according to the method described herein.

The HRI coated film is slit to a width that can be accommodated by common embossing equipment.

Embossing is performed by pressing a shim with the desired grating embedded in its surface onto the embossable substrate, with the HRI coating and the embossable layer facing the embossing shim. For the embossing process the film can either be preheated to allow the embossable layer polymer to be pliable under the embossing shim, or the shim itself is heated and transfers the heat into the embossable layer making it pliable.

Figure 3:
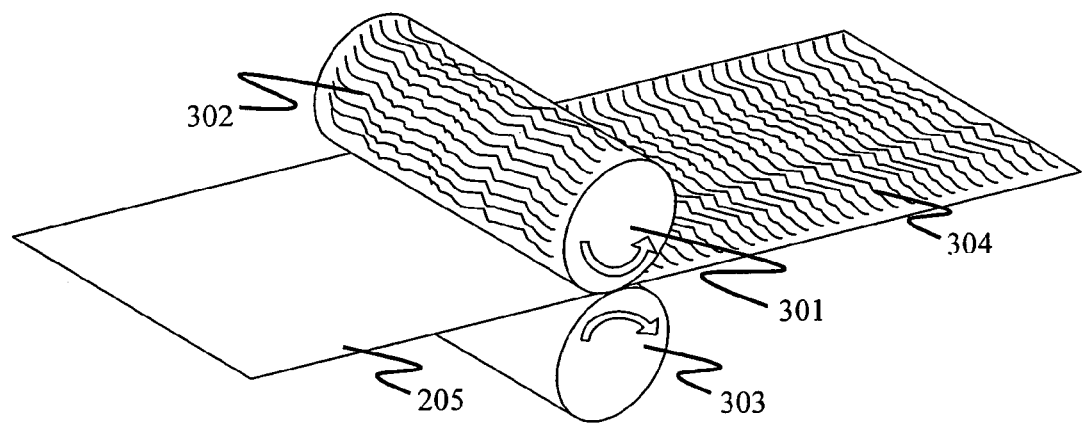
FIG. 3 is a schematic representation of a continuous embossing system used to impose the diffractive grating onto an embossable substrate in accordance with the invention.

FIG. 3 depicts a continuous embossing process. The embossing shim carrying the diffractive grating 302 is wrapped around the embossing drum 301 that is heated to embossing temperature. A contact roller 303 is pressing against the embossing roller to build the contact force that is required to create the embossing. The film substrate 205 is passing between the embossing drum 301 and the contact roller 303, with the embossable surface of the substrate 202/203 facing the embossing drum 301 and its embossing surface 302. The heat of the embossing drum 301 and the pressure between embossing drum 301 and contact roller 303 imposes the surface structure of the embossing shim 302 into the film surface 304.

The embossable polymer would preferably have a low crystalline structure and have a heat seal characteristic. In case of a substrate not coated with the HRI coating this would cause the film to stick to the embossing shim. The sticking can destroy the embossing upon removal of the film from the shim. With the HRI coating applied, however, the sticking does not appear. Furthermore, since the melt temperature of low crystalline polymers is typically much lower than comparable embossable coatings, it is possible to emboss through the HRI, allowing the generation of high brilliance impressions.

The invention is further illustrated by the following examples, which are intended to be exemplary and not limiting.

EXAMPLE 1

A biaxially oriented polypropylene film, type Torayfan F-61W, produced by Toray Plastics (America), Inc., was produced. The film includes a core layer, made from ExxonMobil PP4772, a mini-random homopolymer, a print layer on one side and a heat seal layer, made from Sumitomo WF345R, a low crystalline random co-polymer, on the other side. The heat seal initiation temperature of the heat seal resin is about 100° Celsius. The biaxally oriented film was vacuum coated with a layer of zinc-sulfide (ZnS) using a vacuum coating system with a resistive evaporation source. The thickness of the ZnS layer was about 750 Angstrom.

Subsequently, the coated film was slit and embossed using an embosser with a heated shim. The shim had a surface grating known as a "rainbow pattern". Embossing was performed with an embossing pressure of about 10 bar and different temperature settings. As control samples, embossing of F-61 W without the ZnS coating was also attempted. The results are listed in Table 1.

EXAMPLE 2

A biaxially oriented polyethyleneterephtalate film, type Lumirror PA-20, produced by Toray Plastics (America), Inc., was produced. The film includes a core layer made from crystalline PET, and a heat seal layer, made from isophtalic acid, on one side. The heat seal initiation temperature of this heat seal resin is about 105° Celsius. The PET film was vacuum coated with a layer of Zinc-Sulfide (ZnS) using a vacuum coating system with a resistive evaporation source. The thickness of the ZnS layer was about 500 Angstrom.

Subsequently, the coated film was slit and embossed using an embosser with a heated shim, the shim had a surface grating known as a "Rainbow Wave Pattern". As control samples, embossing of PA-20 without the ZnS coating was also attempted. The results are listed in Table 1.

COMPARABLE EXAMPLE 1

A biaxially oriented polyethleneterephtalate film, type Lumirror F-65, produced by Toray Plastics (America), Inc. was off-line coated with an embossable coating used in the holographic industry. This film was coated with an HRI coating using the above described process. The thickness of the ZnS layer was about 650 Angstrom. The results are listed in Table 1.

Table 1

| Sample Description | Embossing Temperatures | | | | |
| --- | --- | --- | --- | --- | --- |
| | 104° C. | 115° C. | 127° C. | 138° C. | 149° C. |
| F-61W w/ HRI | None | Poor | Good | Excellent | — |
| F-61W w/o HRI | Poor | Sticking | Sticking | — | |
| PA-20 w/ HRI | None | Poor | Good | Excellent | Excellent |
| PA-20 w/o HRI | Poor | Sticking | Sticking | — | |
| F-65 Embossable w/ HRI | None | None | Poor | Poor | Good |
| F-65 Embossable w/o HRI | None | Poor | Good | Excellent | Excellent |

Qualitatively, the embossing of the PET film was rated as follows:
Excellent = Bright colors viewed from many angles
Good = Colors not as robust viewed at from different angles
Poor = Colors dull or incomplete embossing noted
None = No embossing visible The results show that co-extruded film without the HRI coating exhibit the expected heat seal characteristics, resulting in sticking between the substrate and the embossing shim once the heat seal initiation temperature is reached. On the other hand it was possible to achieve excellent embossing results when an overcoating with HRI was present. No sticking of these samples were observed.

In contrast the substrate with the commonly used embossable coating achieves excellent embossing without HRI coating, while it appears that higher temperatures are typically needed to achieve embossing into such coatings when a HRI coating is present.

The examples show that it is possible to use a co-extruded polymer substrate having at least one side including a low crystalline polymer, that usually exhibit heat seal characteristics, as an embossable substrate exhibiting brilliant embossing characteristics when overcoating with an HRI coating. In addition, the examples show that it is possible to precoat co-extruded polymer substrates having at least one side including a low crystalline polymers with an HRI coating and to emboss through the HRI coating with high brilliance.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein.

This application discloses numerical range limitations. Persons skilled in the art will recognize that the numerical ranges disclosed inherently support any range within the disclosed numerical ranges even though a precise range limitation is not stated verbatim in the specification because this invention can be practiced throughout the disclosed numerical ranges and at other numerical ranges which persons skilled in the art will find this invention operable.

We claim:
1. An embossable film comprising:
a base substrate film comprising polyethylene terephthalate (PET), or polypropylene and an embossable layer that is co-extruded with the base substrate film, comprises a polymer selected from the group consisting of PET, polypropylene, cellophane, acetate, nylon, polyamide, polvamide-imide, polyether sulfone and polyether ether ketone and has a melting point at least 10° C. lower than a melting point of the base substrate film; and a transparent high refractive index coating layer on the surface of the embossable layer, the coating layer having an index of refraction at least 0.3 higher than an index of refraction of the embossable layer, wherein the co-extruded embossable layer and base substrate film are biaxially oriented prior to application of the coating layer.

2. The embossable film of claim 1, wherein the base substrate film has a thickness of between 7 μm and 120 μm.

3. The embossable film of claim 1, wherein the embossable layer has a thickness of 0.1 μm to 2.0 μm.

4. The embossable film of claim 1, wherein the transparent high refractive index coating layer comprises ZnS, $Sb_2S_3$, $Fe_2O_3$, PbO, ZnSe, CdS, $TiO_2$, $PbCl_2$, $CeO_2$, $Ta_2O_5$, ZnO, CdO, $Nd_2O_3$ or $Al_2O_3$.

5. The embossable film of claim 1, wherein the transparent high refractive index coating layer has a thickness of 50 Angstroms to 1500 Angstroms.

6. The embossable substrate of claim 1, wherein the transparent high refractive index coating layer is applied using a physical vapor deposition process.

7. The embossable film of claim 1, wherein the embossable layer comprises PET when the base substrate film comprises PET and comprises polypropylene when the base substrate film comprises polypropylene.

8. A method of producing an embossable film comprising:
co-extruding a polymer film comprising a base substrate film comprising polyethylene terephthalate (PET) or polypropylene and an embossable layer that comprises a polymer selected from the group consisting of PET, polypropylene, cellophane, acetate, nylon, polyamide, polyamide-imide, polyether sulfone and polyether ether ketone and has a melting point at least 10° C. lower than a melting point of the substrate film;
biaxially orienting the co-extruded polymer film; and
applying a transparent high refractive index coating layer on top of the embossable layer, the coating layer having an index of refraction at least 0.3 higher than an index of refraction of the embossable layer.

9. The method of claim 8, wherein the base substrate film has a thickness of between 7 μm and 120 μm.

10. The method of claim 8, wherein the embossable layer has a thickness of 0.1 μm to 2.0 μm.

11. The method of claim 8, wherein the transparent high refractive index coating layer comprises ZnS, $Sb_2S_3$, $Fe_2O_3$, PbO, ZnSe, CdS, $TiO_2$, $PbCl_2$, $CeO_2$, $Ta_2O_5$, ZnO, CdO, $Nd_2O_3$ or $Al_2O_3$.

12. The method of claim 8, wherein the transparent high refractive index coating layer has a thickness of 50 Angstroms to 1500 Angstroms.

13. The method of claim 8, wherein the transparent high refractive index coating layer is applied using a physical vapor deposition process.

14. The method of claim 8, wherein the embossable layer comprises PET when the base substrate film comprises PET and comprises polypropylene when the base substrate film comprises polypropylene.

15. A method of producing a diffraction grating comprising:
providing a substrate film comprising a base film comprising polyethylene terephthalate (PET) or polypropylene coextruded with an embossable layer that comprises a variation of PET or polypropylene that has a melting point at least 10° C. lower than a melting point of the base substrate film;
biaxially orienting the substrate film;
applying a transparent high refractive index coating layer on top of the embossable layer, the coating layer having an index of refraction at least 0.3 higher than an index of refraction of the embossable layer; and
embossing the film to create a diffraction grating.

16. The method of claim 15, wherein the embossable layer comprises a variation of the polymer of the base film.

17. The method of claim 15, wherein the base film has a thickness of between 7 μm and 120 μm.

18. The method of claim 15, wherein the embossable layer has a thickness of 0.1 μm to 2.0 μm.

19. The method of claim 15, wherein the transparent high refraetive index coating layer comprises ZnS, $Sb_2S_3$, $Fe_2O_3$, PbO, ZnSe, CdS, $TiO_2$, $PbCl_2$, $CeO_2$, $Ta_2O_5$, ZnO, CdO, $Nd_2O_3$ or $Al_2O_3$.

20. The method of claim 15, wherein the transparent high refractive index coating layer has a thickness of 50 Angstroms to 1500 Angstroms.

21. The method of claim 15, wherein the transparent high refractive index coating layer is applied using a physical vapor deposition process.

* * * * *